United States Patent
Thoulon

Patent Number: 6,128,747
Date of Patent: Oct. 3, 2000

[54] SYSTEM FOR DELAYING PROPAGATION OF WAKE-UP SIGNAL TO PROCESSOR THROUGH THE SLEEP CONTROL MEANS UNTIL THE MEMORY IS AWAKENED

[75] Inventor: Pierre-Yves Thoulon, Grenoble, France

[73] Assignee: Hewlett Packard Company, Fort Collins, Colo.

[21] Appl. No.: 09/008,404

[22] Filed: Jan. 17, 1998

[30] Foreign Application Priority Data

Jan. 28, 1997 [EP] European Pat. Off. ............ 97410011

[51] Int. Cl.⁷ ...................................................... C06F 1/32
[52] U.S. Cl. ........................................ 713/330; 713/300
[58] Field of Search ................... 713/300, 320, 713/323, 330, 321, 324, 310, 601; 455/382; 712/200; 711/106; 365/195, 222, 227; 710/323; 714/14, 22

[56] References Cited

U.S. PATENT DOCUMENTS

| | | | |
|---|---|---|---|
| 5,247,655 | 9/1993 | Khan et al. ........................... | 711/106 |
| 5,262,998 | 11/1993 | Mnich et al. ......................... | 365/222 |
| 5,365,487 | 11/1994 | Patel et al. ............................ | 365/226 |
| 5,404,543 | 4/1995 | Faucher et al. ....................... | 713/323 |
| 5,428,252 | 6/1995 | Walker et al. ......................... | 307/64 |
| 5,454,114 | 9/1995 | Yach et al. ............................ | 713/330 |
| 5,515,539 | 5/1996 | Ohashi et al. ......................... | 713/324 |
| 5,524,249 | 6/1996 | Suboh .................................. | 713/322 |
| 5,568,637 | 10/1996 | Moriya ................................. | 707/1 |
| 5,586,308 | 12/1996 | Hawkins et al. ..................... | 713/501 |
| 5,630,090 | 5/1997 | Keehn et al. ......................... | 711/106 |
| 5,630,143 | 5/1997 | Maher et al. ......................... | 713/310 |
| 5,692,197 | 11/1997 | Narad et al. ......................... | 713/323 |
| 5,721,935 | 2/1998 | DeSchepper et al. ................ | 713/323 |
| 5,774,736 | 5/1997 | Wright et al. ........................ | 713/330 |
| 5,813,022 | 9/1998 | Ramsey et al. ...................... | 711/3 |
| 5,842,029 | 11/1998 | Conary et al. ....................... | 713/322 |
| 5,931,951 | 8/1999 | Ando .................................... | 713/324 |

FOREIGN PATENT DOCUMENTS

| | | |
|---|---|---|
| 0071743A3 | 6/1982 | European Pat. Off. . |
| 0632463A2 | 6/1994 | European Pat. Off. . |
| 0707256A2 | 4/1996 | European Pat. Off. . |
| 0708398A2 | 4/1996 | European Pat. Off. . |

OTHER PUBLICATIONS

European Search Report, EP 97 41 0011, Jun. 19, 1997.

*Primary Examiner*—Meng-Al T. An
*Assistant Examiner*—Walter Benson
*Attorney, Agent, or Firm*—Ohlandt, Greeley, Ruggiero & Perle, L.L.P.

[57] ABSTRACT

An electronic device such as a computer, is provided with a processor responsive to a sleep signal being asserted to emit a sleep acknowledgement signal and enter a low power mode, and a memory which is also settable in a low power mode. The memory is, for example, a DRAM with a self refresh mode. Control of entry of the memory into its low power (or sleep) mode is effected by a sleep control circuit. This circuit sets the memory into its low power mode upon detection of the sleep acknowledgement signal emitted by the processor. Preferably, the sleep control circuit forms part of a memory controller, and the sleep acknowledgement signal is a bus transaction, that is detected by the memory controller.

8 Claims, 1 Drawing Sheet

SYSTEM FOR DELAYING PROPAGATION OF WAKE-UP SIGNAL TO PROCESSOR THROUGH THE SLEEP CONTROL MEANS UNTIL THE MEMORY IS AWAKENED

FIELD OF THE INVENTION

The present invention relates to an electronic device comprising a processor responsive to a sleep signal being asserted to emit an acknowledgement signal and enter a low power mode, and a memory settable in a low power mode.

It also relates to a method for setting into low power mode an electronic device with a memory settable in a low power mode and a processor responsive to a sleep signal being asserted to emit an acknowledgement signal and enter a low power mode.

The invention further relates to a memory controller.

BACKGROUND OF THE INVENTION

Memories with self refresh mode are becoming more and more common. For instance synchronous dynamic random access memories (SDRAMs) presenting these features are sold by Fujitsu, NEC, Samsung and other memory suppliers, and are used extensively in recent computers. U.S. Pat. No. 5,262,998 (Mnich et al.) discloses a DRAM exhibiting a sleep or low power mode of operation, entered in response to a single externally applied signal.

It is also a trend in the computer industry to provide sleep or low power modes for computers and associated monitors. This is based on environnemental considerations, and practical considerations, e.g. for laptop computers. Therefore, a standard for controlling the setting a processor into sleep mode has been defined as part of the recent Advanced Configuration and Power Interface (ACPI) specification.

In recent processors, it has been possible to set the processor in a sleep mode by applying a sleep signal to a specific pin of the processor, as for instance the STPCLK# of the Pentium™ Pro microprocessors sold by Intel Corp. The processor, when receiving the sleep signal carries out certain tasks for ensuring that it can correctly resume operation when woken up, these tasks including internal clean-up and update of memory. The processor may then transmit on the processor bus a transaction indicating that it is passing into sleep mode; in the case of the Pentium Pro processor, a STPCLK ACK transaction is sent on the bus when the processor passes into sleep mode.

However, there is no standardized solution at the system level for setting a memory to the sleep or low power mode. One solution is disclosed for instance in EP-A-0 632 463 (Casio Computer Company). This document discloses an electronic device with a CPU, a pseudo-SRAM having a sleep mode and a specific circuit for sending sleep signals to the CPU and to the pseudo-SRAM. This approach requires specific hardware solutions; furthermore, inasmuch as the memory sleep mode is not yet standardized, this approach may only be used for memories of a given type.

U.S. Pat. No. 5,262,998 suggests that the memory sleep mode may be entered in response to a command from the CPU, the memory controller being trigged by this command to generate a sleep signal for putting the memory chips into the sleep mode. This solution is disadvantageous in that the processor needs to run specific firmware for entering the sleep mode. This solution also means that the processor must know which type of command it should issue to set the memory into its sleep mode. Again, this limits the use of this solution to certain types of memories or memory controllers.

A similar problem is encountered at wake-up. The processor will not work properly if the memory is still in its sleep mode. The solution to this wake up problem according to EP-A-0 632 463 is to send the wake up signal to the memory before sending the wake up signal to the processor. This solution has the same drawback, i.e. implies using a specific circuit. U.S. Pat. No. 5,262,998 does not address this wake up problem where the memory sleep mode is entered in response to a command from the CPU: it rather provides a specific memory sleep mode which is transparent to the CPU and allows rapid resumption of active cycles.

There exists a need for a solution to control sleep mode in electronic devices, that is of a more general nature than the specific hardware and firmware solutions described above.

SUMMARY OF THE INVENTION

According to the present invention, there is provided an electronic device comprising a processor responsive to a sleep signal being asserted to emit an acknowledgement signal and enter a low power mode, a memory settable in a low power mode, and sleep control means for setting the memory into its low power mode upon detection of said acknowledgement signal.

Preferably, the sleep control means is incorporated into a memory controller.

The device may further comprise a bus connected to the processor and to the memory controller, and in this case the acknowledgement signal is preferably a transaction on the bus.

Preferably the memory controller is also settable into the low power mode, and the sleep control means are arranged to control the low power mode of the memory controller.

The memory may also have self refresh circuitry that is operative when the memory is set in its low power mode.

In one embodiment the sleep-control means are responsive to the sleep signal being deasserted to wake up the memory from its low power mode. In this case, the sleep control means may be arranged to delay de-assertion of the sleep signal to the processor till the memory is woken up.

In another embodiment, the sleep control means is responsive to transactions being exchanged on the bus to wake up the memory from its low power mode.

The invention also provides a method for setting into low power mode an electronic device with a memory settable in a low power mode and a processor responsive to a sleep signal being asserted to emit an acknowledgement signal and enter a low power mode, the method comprising the steps of:

(i) detecting the emission by the processor of an acknowledgement signal (ii) setting the memory into low power mode in response to step (i).

In a preferred embodiment, the method further comprises:

(iii) detecting de-assertion of the sleep signal to the processor;

(iv) waking up the memory from low power mode in response to step (iii).

In this case, the method preferably comprises:

(v) delaying de-assertion of the sleep signal to the processor till the memory is woken up.

In another preferred embodiment, the device further comprises a bus connected to the processor, and the method comprises:

(iii) monitoring transactions on the bus;

(iv) waking up the memory from low power mode when transactions are detected on the bus.

The invention further relates to a memory controller for connection to a bus and to a memory, comprising sleep control means for detecting on the bus a sleep acknowledgement transaction from a processor and for setting the memory into the low power mode upon detection of said acknowledgement transaction.

Preferably, the memory controller is also settable into the low power mode, and the sleep control means are arranged to control the low power mode of the memory controller.

The sleep control means may be responsive to transactions being exchanged on the bus to wake up the memory controller from its low power mode.

BRIEF DESCRIPTION OF THE DRAWINGS

A computer memory controller embodying the invention will now be described, by way of non-limiting example, with reference to the accompanying drawings, the sole FIGURE of which (FIG. 1) is a diagrammatic representation of part of a computer incorporating the memory controller.

BEST MODE OF CARRYING OUT THE INVENTION

Figure 1:
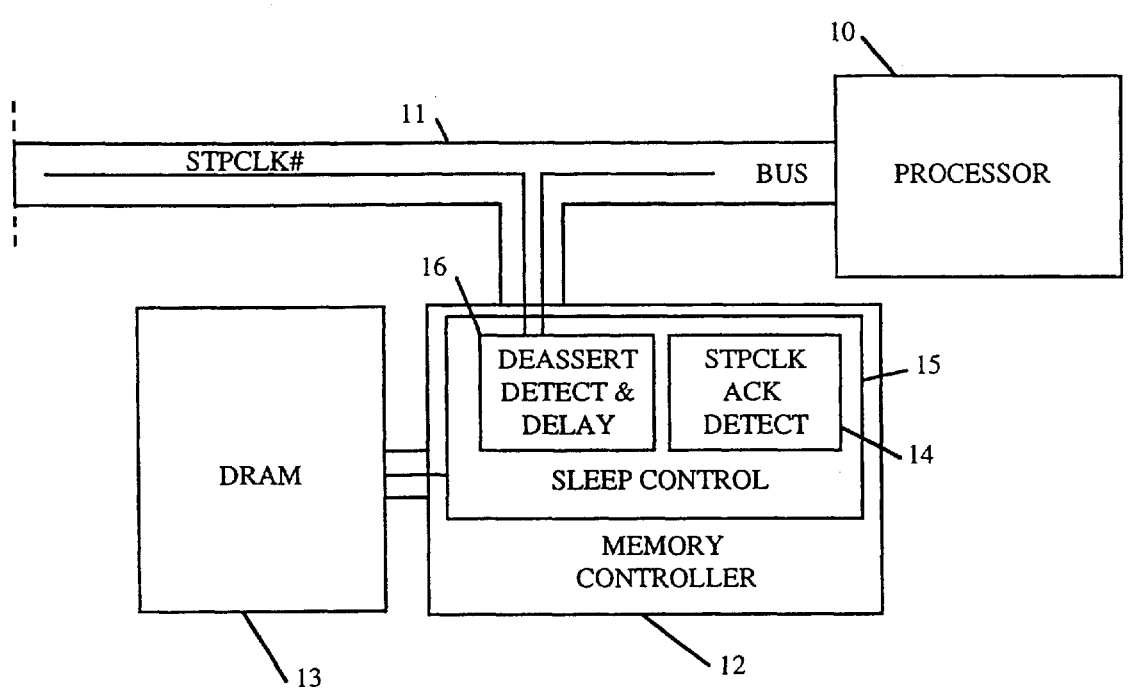

FIG. 1 is a diagrammatic view of the relevant part of a computer embodying the invention. The computer of FIG. 1 is only one example of an electronic device in which the invention can be carried out; it is clear that the invention may equally be used for other types of processor-based electronic devices.

The computer of FIG. 1 comprises a processor or CPU 10, connected to a bus 11. A memory controller 12 is connected to the bus, and a memory 13 is connected to the memory controller 12.

Processor 10 is responsive to a sleep signal being asserted to enter a sleep or low power mode. This sleep signal may be asserted on a specific pin or terminal of the processor 10, as is the case for the Pentium Pro processor (where the sleep signal is referred to as STPCLK#); the sleep signal could also be a specific transaction occurring on the bus 11. Whatever the case, the sleep signal may be asserted when the electronic device is not used for a given amount of time, as detected by any suitable means; any conventional solution such as software or hardware timers may be used for asserting the sleep signal.

When processor 10 enters its sleep or low power mode, it will emit an acknowledgement signal. This acknowledgement signal may be of any type. The use of the present invention is especially advantageous when this acknowledgement signal is a transaction sent on bus 11 by the processor 10, as for instance the STPCLK ACK transaction of the Pentium Pro processor. However, the acknowledgement signal could be of any other type.

According to the invention, this acknowledgement signal is used in order to control the setting of the memory 13 to the low power mode. This avoids the need for providing specific commands in the processor for setting the memory into sleep mode, as in U.S. Pat. No. 5,262,998, and ensures that the invention can be implemented transparently for the processor, with any kind of memory settable to a sleep or low power mode.

If the acknowledgement signal is a transaction 14 sent on bus 11 by the processor 10, the means 14 for detecting the acknowledgement signal and for setting the memory into low power mode may be incorporated in sleep control means 15 provided in the memory controller 12. This makes the invention especially easy to implement; indeed, in this case, it is not necessary to provide any new circuitry, and it is sufficient to program the memory controller so that it will recognize the acknowledgement transaction on the bus, and emit in correspondence to this transaction a sleep command to the memory 13.

In other cases, the implementation of the sleep control means for detecting the acknowledgement signal will depend on the nature of the acknowledgement signal. Whatever the case, the solution of the invention will be transparent to the processor, and will not involve any specific firmware for the processor.

In a preferred embodiment of the invention, the memory controller 12 is also settable into a low power mode, and the sleep control means 15 are arranged to control the low power mode of the memory controller 12. For instance, the sleep control means 15 will set the memory controller into its low power mode only after the memory 13 have been set into its low power mode. This provides reduced power consumption, and is also easy to implement transparently for the processor, especially if the sleep control means 15 are part of the memory controller.

The invention may be used for instance with SDRAMs or other types of memories having a self refresh mode. In this case, the memory 13 will enter self refresh mode when it is set into the low power mode.

The invention thus provides a simple and easy solution to the problem of setting both the processor and the memory into sleep or low power mode. As apparent to the person skilled in the art, the use of the invention makes the memory low power mode transparent to the processor, and avoids the need for any specific processor firmware. The solution provides for a quick setting of the memory into the sleep mode, as soon as the processor emits the sleep acknowledgement signal.

As regards wake up of the memory, a number of approaches are possible. According to a first approach applicable to arrangements where the sleep signal is a signal applied to dedicated pin(s) of the processor and is held asserted throughout the time the processor is to be kept in its sleep mode, the sleep control means 15 for setting the memory into the low power mode are also arranged to detect and monitor the sleep signal, and are responsive to this sleep signal being deasserted to wake up the memory from its low power mode. Monitoring the sleep signal in this way provides a simple solution for knowing when the memory should be woken up.

An extension to this approach is to have the sleep control means 15 delay propagation of de-assertion of the sleep signal to the processor till the memory 13 is woken up. This may be done by delaying the de-assertion of the sleep signal (see de-assertion detect and delay block 16) for a predetermined period of time corresponding to the time necessary for wake up of the memory. This ensures that the memory is woken up and operative when the processor wakes up.

In a second approach to memory wake-up, the sleep control means 15 for setting the memory to the low power mode are responsive to transactions being exchanged on the bus to wake up the memory from its low power mode. This approach is advantageous since it does not require the sleep control means 15 to monitor the sleep signal. It is also advantageous in that it can be used even in cases where the sleep signal is not asserted throughout all the processor sleep period but only to initiate the sleep mode. Another advantage of this approach is that the memory may be temporarily woken up for memory accesses that do not require wake up of the processor, e. g. direct memory accesses by I/O devices, independently from the processor; in this case, the memory is returned to its sleep mode when, for example, no bus transactions are detected for a given period.

With the above-described second approach to memory wake-up, the initial processor accesses to the memory may need to be deferred by the memory controller either by buffering the access or by indicating to the processor that it should try again later. This will not really slow the overall wake up sufficiently that this is perceived by the user. Rather than deferring attempted memory accesses, it is possible to build in some delay in the processor operation after the first transaction it receives, to ensure that the memory has sufficient time to wake up.

It is also possible to have the sleep control means 15 emit a transaction on the bus to indicate when the memory is being woken up, this transaction being used by the processor to determine when it should attempt to access the memory.

The described embodiments thus provide a solution for setting in the sleep mode not only the processor, but also the memory, and for ensuring proper wake up of the memory and the processor. The solution provided by the present invention is transparent to the processor, and avoids any specific firmware in the processor. It may be implemented in the memory controller, wherein the specific features of the memories actually used will in any case be taken into account: this means that the implementation of the present invention is possible with little or no extra cost.

The foregoing description of the best mode of carrying out the invention was only given as an example. The invention may be used in devices other than a computer, or may be used in multiprocessor computers.

What is claimed is:

1. An electronic device comprising a processor responsive to a sleep signal being asserted to emit an acknowledgement signal and enter a low power mode, a memory settable in a low power mode, and sleep control means for setting the memory into the low power mode upon detection of said acknowledgement signal, wherein the sleep control means are responsive to the sleep signal being de-asserted to wake up the memory from its low power mode and delay propagation of said de-assertion of the sleep signal through said sleep control means to the processor until the memory is awakened.

2. An electronic device according to claim 1, further comprising a memory controller, wherein the sleep control means are incorporated in the memory controller.

3. An electronic device according to claim 2, further comprising a bus connected to the processor and to the memory controller, wherein the acknowledgement signal is a transaction on the bus.

4. An electronic device according to claim 2, wherein the memory controller is also settable into the low power mode, and wherein the sleep control means are arranged to control the low power mode of the memory controller.

5. An electronic device according to claim 1, wherein the memory has self refresh circuitry that is operative when the memory is set in its low power mode.

6. A method for setting into low power mode an electronic device comprising a memory settable in a low power mode and a processor responsive to a sleep signal being asserted by emitting an acknowledgement signal and by entering a low power mode, said method comprising the steps of:

(i) detecting the emission by the processor of said acknowledgement signal;

(ii) setting the memory into low power mode in response to step (i);

(iii) detecting a de-assertion of the sleep signal;

(iv) waking up the memory from low power mode in response to step (iii); and (v) delaying propagation of said de-assertion of the sleep signal throuqh a sleep control means to the processor until said memory is awakened.

7. A memory controller for connection to a bus and to a memory, said memory controller comprising sleep control means for detecting on the bus a sleep acknowledgement transaction from a processor and for setting the memory into the low power mode upon detection of said acknowledgement transaction, wherein the sleep control means are responsive to the sleep signal being de-asserted to wake up the memory from its low power mode and delay propagation of said de-assertion of the sleep signal through said sleep control means to the processor until the memory is awakened.

8. A memory controller according to claim 7, wherein the memory controller is also settable into a low power mode, and wherein the sleep control means are arranged to control the low power mode of the memory controller.

* * * * *